US011084923B2

(12) United States Patent
Marrani et al.

(10) Patent No.: US 11,084,923 B2
(45) Date of Patent: Aug. 10, 2021

(54) FLUOROPOLYMER COMPOSITIONS COMPRISING A COPOLYMER OF VINYLIDENE FLUORIDE AND TRIFLUOROETHYLENE AND A FLUORINATED ELASTOMER

(71) Applicant: SOLVAY SPECIALTY POLYMERS ITALY S.P.A., Bollate (IT)

(72) Inventors: Alessio Marrani, Lecco (IT); Francesco Pedroli, Lyons (FR)

(73) Assignee: SOLVAY SPECIALTY POLYMERS ITALY S.P.A., Bollate (IT)

(*) Notice: Subject to any disclaimer, the term of this patent is extended or adjusted under 35 U.S.C. 154(b) by 0 days.

(21) Appl. No.: 15/780,160

(22) PCT Filed: Nov. 25, 2016

(86) PCT No.: PCT/EP2016/078885
§ 371 (c)(1),
(2) Date: May 30, 2018

(87) PCT Pub. No.: WO2017/093145
PCT Pub. Date: Jun. 8, 2017

(65) Prior Publication Data
US 2018/0371226 A1 Dec. 27, 2018

(30) Foreign Application Priority Data

Nov. 30, 2015 (EP) .................................... 15197088

(51) Int. Cl.
| C08L 27/16 | (2006.01) |
| H01L 41/45 | (2013.01) |
| H01L 41/193 | (2006.01) |
| C09D 127/16 | (2006.01) |
| C08J 5/18 | (2006.01) |
| C08L 33/14 | (2006.01) |

(52) U.S. Cl.
CPC ............... *C08L 27/16* (2013.01); *C08J 5/18* (2013.01); *C08L 33/14* (2013.01); *C09D 127/16* (2013.01); *H01L 41/193* (2013.01); *H01L 41/45* (2013.01); *C08J 2300/26* (2013.01); *C08J 2327/16* (2013.01); *C08L 2203/16* (2013.01); *C08L 2203/20* (2013.01); *C08L 2205/025* (2013.01)

(58) Field of Classification Search
CPC ............................. C08L 27/16; C09D 127/16
See application file for complete search history.

(56) References Cited

U.S. PATENT DOCUMENTS

| 4,035,565 A | 7/1977 | Apotheker et al. |
| 4,243,770 A | 1/1981 | Tatemoto et al. |
| 4,555,543 A * | 11/1985 | Effenberger ........... C04B 41/009 428/422 |
| 4,560,737 A | 12/1985 | Yamamoto et al. |
| 4,564,662 A | 1/1986 | Albin |
| 4,569,978 A * | 2/1986 | Barber ..................... C08F 14/22 526/206 |
| 4,694,045 A | 9/1987 | Moore |
| 4,713,418 A * | 12/1987 | Logothetis ............... C08L 27/18 525/199 |
| 4,745,165 A | 5/1988 | Arcella et al. |
| 4,943,622 A | 7/1990 | Naraki et al. |
| 4,990,283 A | 2/1991 | Visca et al. |
| 5,173,553 A | 12/1992 | Albano et al. |
| 5,371,143 A * | 12/1994 | Novak ...................... C08J 3/245 525/165 |
| 5,498,680 A | 3/1996 | Abusleme et al. |
| 6,025,436 A * | 2/2000 | Kawashima ............ B29C 43/24 264/175 |
| 6,103,843 A | 8/2000 | Abusleme et al. |
| 2003/0052576 A1 | 3/2003 | St Clair et al. |
| 2004/0054050 A1* | 3/2004 | Pascal ..................... C08F 14/08 524/306 |
| 2009/0011164 A1* | 1/2009 | Masuda .................. C08L 27/18 428/36.92 |
| 2011/0082271 A1* | 4/2011 | Brinati ................ C08F 214/182 526/209 |
| 2013/0264522 A1* | 10/2013 | Stanga ..................... C08F 14/22 252/500 |
| 2013/0296512 A1* | 11/2013 | Marrani ............... C08F 214/225 526/209 |
| 2014/0001453 A1 | 1/2014 | Cho et al. |
| 2014/0213730 A1 | 7/2014 | Chernysheva et al. |
| 2016/0177079 A1* | 6/2016 | Bandi ..................... C08L 27/12 525/200 |
| 2018/0044456 A1* | 2/2018 | Freeman .................. C08L 27/16 |

FOREIGN PATENT DOCUMENTS

| EP | 199138 A2 | 10/1986 |
| EP | 661304 A1 | 7/1995 |
| EP | 0738757 A2 * | 10/1996 ............ C08L 51/003 |
| WO | 200131172 A2 | 5/2001 |
| WO | 2011008940 A1 | 1/2011 |
| WO | 2012084579 A1 | 6/2012 |
| WO | 2015169836 A1 | 11/2015 |

* cited by examiner

Primary Examiner — Nicole M. Buie-Hatcher
(74) Attorney, Agent, or Firm — Osha Bergman Watanabe & Burton LLP

(57) ABSTRACT

The present invention pertains to a fluoropolymer composition comprising a copolymer of vinylidene fluoride (VDF) and trifluoroethylene (TrFE), to a process for the manufacture of said fluoropolymer composition and to uses of said fluoropolymer composition in various applications, in particular to uses of fluoropolymer films obtainable therefrom in electrical or electronic devices.

18 Claims, No Drawings

FLUOROPOLYMER COMPOSITIONS COMPRISING A COPOLYMER OF VINYLIDENE FLUORIDE AND TRIFLUOROETHYLENE AND A FLUORINATED ELASTOMER

This application is a U.S. national stage entry under 35 U.S.C. 071 of International Application No. PCT/EP2016/078885 filed Nov. 25, 2016, which claims priority to European application No. EP 15197088.6 filed on Nov. 30, 2015. The entire contents of these applications are explicitly incorporated herein by this reference.

TECHNICAL FIELD

The present invention pertains to a fluoropolymer composition, to a process for the manufacture of said fluoropolymer composition and to uses of said fluoropolymer composition in various applications.

BACKGROUND ART

Vinylidene fluoride (VDF) copolymers comprising recurring units derived from trifluoroethylene (TrFE) have been used extensively in the manufacture of both electrical and electronic devices due to their ease of processing, chemical inertness and attractive ferroelectric, piezoelectric, pyroelectric, ferrorelaxor and dielectric properties.

In particular, due to their high dielectric constants and attractive ferrorelaxor properties, vinylidene fluoride (VDF) terpolymers comprising recurring units derived from trifluoroethylene (TrFE) and chlorotrifluoroethylene (CTFE) have been used in the manufacture of thin film transistor (TFT) devices.

As is well known, the term piezoelectric means the ability of a material to exchange electrical for mechanical energy and vice versa and the electromechanical response is believed to be essentially associated with dimensional changes during deformation or pressure oscillation. The piezoelectric effect is reversible in that materials exhibiting the direct piezoelectric effect (the production of electricity when stress is applied) also exhibit the converse piezoelectric effect (the production of stress and/or strain when an electric field is applied).

Ferroelectricity is the property of a material whereby this latter exhibits a spontaneous electric polarization, the direction of which can be switched between equivalent states by the application of an external electric field.

Pyroelectricity is the ability of certain materials to generate an electrical potential upon heating or cooling. Actually, as a result of this change in temperature, positive and negative charges move to opposite ends through migration (i.e. the material becomes polarized) and hence an electrical potential is established.

Ferrorelaxor is the property of an electroactive material whereby this latter exhibits a large displacement when an electrical field is applied but with no force transfer while actuating.

Materials having good dielectric properties are known in the art.

For instance, US 2014/0001453 (CHO ET AL.) Jan. 2, 2014 discloses a thin film transistor (TFT) device comprising an organic insulating layer wherein a VDF-TrFE polymer is mixed with an amorphous polymer selected from polymethyl methacrylate, polystyrene, polyvinylpyrrolidone and polyimide.

However, high dielectric constant materials typically suffer from poor insulating performances.

Also, nowadays, in view of miniaturization of film electronic devices such as organic thin film transistor (OTFT) devices, one of the key electrical parameters to fabricate reliable and stable electronic devices is to reduce the leakage current. The leakage current can be an indicator of the effectiveness of insulation of the gate dielectric material on conductors. Low levels of leakage current allow to build devices having high power efficiencies and lifetime. On the other side, high levels of leakage current can cause voltages that disrupt normal operation of the equipment.

Hence, high dielectric materials have become even more desirable for manufacturing high performance electrical and electronic devices.

Further, the development of lower cost manufacturing techniques involving solution-based processes is currently requested. Thus, in these techniques, it remains key to provide for stable and homogeneous solutions of fluorinated polymers as starting materials.

In view of the above, there is still the need in the art for fluoropolymer compositions which can be easily processed in solution phase thereby providing homogeneous films endowed with a high dielectric constant and a low leakage current to be suitably used in electrical or electronic devices.

SUMMARY OF INVENTION

It has been now found that the composition of the present invention may be advantageously dissolved in a liquid medium thereby providing stable and homogeneous solutions which can be easily processed thereby providing homogeneous films endowed with good mechanical properties which are suitable for use in various applications including electrical or electronic devices.

It has been also surprisingly found that film of the present invention has outstanding electrical insulating properties while maintaining high dielectric properties.

In particular, it has been found that the film of the present invention is advantageously endowed with a high electrical resistivity corresponding to a low leakage current.

It is essential that the polymer (F) comprises from 17% to 45% by moles of recurring units derived from trifluoroethylene (TrFE) in order to advantageously retain its ferroelectric and/or piezoelectric and/or pyroelectric and/or ferrorelaxor properties.

Also, it has been found that the film of the present invention is advantageously endowed with a high dielectric constant corresponding to a high capacitance.

In a first instance, the present invention pertains to a composition [composition (C)] comprising:
  (A) at least one fluoropolymer [polymer (F)] comprising:
    recurring units derived from vinylidene fluoride (VDF),
    from 17% to 45% by moles, preferably from 19% to 40% by moles, with respect to the total amount by moles of recurring units of said polymer (F), of recurring units derived from trifluoroethylene (TrFE), and
    optionally, from 1% to 15% by moles, preferably from 4% to 10% by moles, with respect to the total amount by moles of recurring units of said polymer (F), of recurring units derived from at least one (per)fluorinated monomer different from VDF and TrFE,
  wherein the recurring units derived from vinylidene fluoride (VDF) are the complement to 100% by moles of total recurring units, and (B) at least one (per)fluoroelastomer [elastomer (F)].

The composition (C) advantageously comprises:

(A) from 90% to 99% by weight, preferably from 95% to 98.5% by weight of at least one polymer (F) and (B) from 1% to 10% by weight, preferably from 1.5% to 5% by weight of at least one (per)fluoroelastomer [elastomer (F)].

The composition (C) of the invention typically further comprises a liquid medium [medium (L)].

For the purpose of the present invention, the term "liquid medium [medium (L)]" is intended to denote a medium comprising one or more compounds in liquid state at 20° C. under atmospheric pressure.

The nature of the medium (L) is not particularly limited provided that it is suitable for dissolving the polymer (F).

The medium (L) typically comprises one or more organic solvents.

For the purpose of the present invention, the term "organic solvent" is used in its usual meaning, that is to say that it refers to an organic compound capable of dissolving another compound (solute) to form a uniformly dispersed mixture at molecular level. In the case the solute is a polymer such as the polymer (F), it is common practice to refer to a solution of the polymer in a solvent when the resulting mixture is clear and no phase separation is visible in the system. Phase separation is taken to be the point, often referred to as "cloud point", at which the solution becomes turbid or cloudy due to formation of polymer aggregates or at which the solution turns into a gel.

The term "gel" is used herein in its usual meaning, that is to say that it refers to a substance which does not flow.

Non limiting examples of suitable organic solvents are selected from the group consisting of:

aliphatic hydrocarbons including, more particularly, paraffins such as, in particular, pentane, hexane, heptane, octane, nonane, decane, undecane, dodecane or cyclohexane, and naphthalene and aromatic hydrocarbons and more particularly aromatic hydrocarbons such as, in particular, benzene, toluene, xylenes, cumene, petroleum fractions composed of a mixture of alkylbenzenes, aliphatic or aromatic halogenated hydrocarbons including, more particularly, perchlorinated hydrocarbons such as, in particular, tetrachloroethylene, hexachloroethane, partially chlorinated hydrocarbons such as dichloromethane, chloroform, 1,2-dichloroethane, 1,1,1-trichloroethane, 1,1,2,2-tetrachloroethane, pentachloroethane, trichloroethylene, 1-chlorobutane, 1,2-dichlorobutane, monochlorobenzene, 1,2-dichlorobenzene, 1,3-dichlorobenzene, 1,4-dichlorobenzene, 1,2,4-trichlorobenzene or mixture of different chlorobenzenes, aliphatic, cycloaliphatic or aromatic ether oxides, more particularly, diethyl oxide, dipropyl oxide, diisopropyl oxide, dibutyl oxide, methyltertiobutylether, dipentyl oxide, diisopentyl oxide, ethylene glycol dimethyl ether, ethylene glycol diethyl ether, ethylene glycol dibutyl ether benzyl oxide; dioxane, tetrahydrofuran (THF), glycol ethers such as ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono-n-butyl ether, glycol ether esters such as ethylene glycol methyl ether acetate, ethylene glycol monoethyl ether acetate, ethylene glycol monobutyl ether acetate, alcohols such as methyl alcohol, ethyl alcohol, diacetone alcohol, ketones such as acetone, methylethylketone, methylisobutyl ketone, diisobutylketone, cyclohexanone, isophorone, linear or cyclic esters such as methyl acetoacetate, dimethyl phthalate, γ-butyrolactone, linear or cyclic carboxamides such as N,N-dimethylacetamide (DMAC), N,N-diethylacetamide, dimethylformamide (DMF), diethylformamide or N-methyl-2-pyrrolidone (NMP), organic carbonates for example dimethyl carbonate, diethyl carbonate, dipropyl carbonate, dibutyl carbonate, ethylmethyl carbonate, ethylene carbonate, vinylene carbonate, phosphoric esters such as trimethyl phosphate, triethyl phosphate, and ureas such as tetramethylurea, tetraethylurea.

For embodiments wherein the composition (C) further comprises a medium (L), the medium (L) is preferably free from organic solvents qualified as Carcinogenic, Mutagenic or Toxic to Reproduction according to chemical safety classification (CMR solvents); more specifically, the medium (L) is advantageously substantially free from NMP, DMF and DMAC.

In a second instance, the present invention pertains to a fluoropolymer film [film (F)] comprising the composition (C) as defined above.

In a third instance, the present invention pertains to a process for manufacturing the film (F) of the invention, said process comprising processing the composition (C) as defined above into a film.

Should the composition (C) further comprises a medium (L), the film (F) of the invention is typically obtainable by a process comprising:

(i) providing a substrate, (ii) providing a composition [composition (C)] as defined above, said composition further comprising a liquid medium [medium (L)], (iii) applying the composition (C) provided in step (ii) onto at least one surface of the substrate provided in step (i) thereby providing a wet film, and (iv) drying the wet film provided in step (iii) thereby providing the fluoropolymer film [film (F)].

It has been found that the film (F) obtainable by the process of the invention is advantageously a homogeneous fluoropolymer film having good mechanical properties to be suitably used in various applications.

For the purpose of the present invention, the term "film" is intended to denote a flat piece of material having a thickness smaller than either of its length or its width.

Under step (i) of the process for manufacturing the film (F) of the invention, the substrate is typically a non-porous substrate.

By the term "non-porous substrate" it is hereby intended to denote a dense substrate layer free from pores of finite dimensions.

Under step (iii) of the process for manufacturing the film (F) of the invention, the composition (C) is applied onto at least one surface of the substrate provided in step (i) typically by using a processing technique selected from the group consisting of casting, spray coating, roll coating, doctor blading, slot die coating, gravure coating, ink jet printing, spin coating, screen printing, brush, squeegee, foam applicator, curtain coating and vacuum coating.

Under step (iv) of the process for manufacturing the film (F) of the invention, the wet film provided in step (iii) is dried typically at a temperature comprised between 50° C. and 200° C., preferably at a temperature comprised between 65° C. and 150° C.

Drying can be performed either under atmospheric pressure or under vacuum. Alternatively, drying can be performed under modified atmosphere, e.g. under an inert gas, typically exempt notably from moisture (water vapour content of less than 0.001% v/v).

The drying temperature will be selected so as to effect removal by evaporation of one or more organic solvents from the film (F) of the invention.

The film (F) is typically free from any organic solvent.

The film (F) advantageously has a thickness comprised between 100 nm and 100 μm.

The thickness of the film (F) can be measured according to any suitable techniques such as reflectometry, profilometry, scanning electron microscopy and atomic force microscopy.

The composition (C) may further comprise one or more additives.

The choice of the additives is not particularly limited provided that they do not interfere with solubility of the polymer(s) (F) in the medium (L).

Non-limitative examples of suitable additives include, notably, pigments, UV absorbers, crosslinking agents, crosslinking initiators, organic and inorganic fillers such as ceramics, glass, silica, conductive metal particles, semiconductive oxides, carbon nanotubes, graphenes, core-shell particles, encapsulated particles, conductive salts, silicon-based particles.

Should the composition (C) further comprise one or more additives, the film (F) thereby provided typically comprises a composition (C) further comprising at least one additive.

Should the composition (C) further comprise one or more additives selected from the group consisting of crosslinking agents and crosslinking initiators, the film (F) thereby provided is advantageously a crosslinkable fluoropolymer film [film (FC)] which typically comprises a composition (C) further comprising at least one additive selected from the group consisting of crosslinking agents and crosslinking initiators.

The crosslinking agent is typically a poly(meth)acrylic compound [compound (PMA)] comprising end groups of formula:

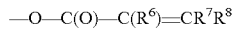

wherein each of $R^6$, $R^7$ and $R^8$, equal to or different from each other, is independently a hydrogen atom or a $C_1$-$C_3$ hydrocarbon group.

The compound (PMA) is more preferably selected from the group consisting of ethylene glycol di(meth)acrylate, diethylene glycol di(meth)acrylate, triethylene glycol di(meth)acrylate, tetraethylene glycol di(meth)acrylate, polyethylene glycol di(meth)acrylate, 1,6-hexanediol di(meth)acrylate, 1,3-butylene glycol di(meth)acrylate, tripropylene glycol di(meth)acrylate, ethoxylated bisphenol A di(meth)acrylate, cyclohexane dimethanol di(meth)acrylate, tris[2-(acryloyloxy)ethyl]isocyanurate, trimethylol propane triacrylate, ethylene oxide added trimethylol propane triacrylate, pentaerythritol triacrylate, tris(acrylooxyethyl) isocyanurate, dipentaerythritol hexaacrylate and caprolactone denatured dipentaerythritol hexaacrylate.

The crosslinking initiator may be a photoinitiator [initiator (PI)] or a thermal initiator [initiator (TI)].

The photoinitiator [initiator (PI)] is typically selected from the group consisting of alpha-hydroxyketones, phenylglyoxylates, benzyldimethyl ketals, alpha-aminoketones and bis acyl phosphines.

Among alpha-hydroxyketones, mention can be made of 1-hydroxy-cyclohexyl-phenyl-ketone, 2-hydroxy-2-methyl-1-phenyl-1-propanone and 2-hydroxy-1-[4-(2-hydroxyethoxy)phenyl]-2-methyl-1-propanone.

Among phenylglyoxylates, mention can be made of methylbenzoylformate, oxy-phenyl-acetic acid 2-[2-oxo-2-phenyl-acetoxy-ethoxy]-ethyl ester and oxy-phenyl-acetic 2-[2-hydroxy-ethoxy]-ethyl ester.

Among benzyldimethyl ketals, mention can be made of alpha, alpha-dimethoxy-alpha-phenylacetophenone.

Among alpha-aminoketones, mention can be made of 2-benzyl-2-(dimethylamino)-1-[4-(4-morpholinyl) phenyl]-1-butanone and 2-methyl-1-[4-(methylthio)phenyl]-2-(4-morpholinyl)-1-propanone.

Among bis acyl phosphines, mention can be made of diphenyl-(2,4,6-trimethylbenzoyl)-phosphine oxide.

Among initiators (PI), those which are liquid at room temperature are preferred.

A class of initiators (PI) which gave particularly good results has been that of alpha-hydroxyketones, in particular 2-hydroxy-2-methyl-1-phenyl-1-propanone.

The amount of initiator (PI) in the composition (C) is not particularly limited. It will be generally used in an amount comprised between 0.01% and 10% by weight, with respect to the total weight of the composition (C). According to an embodiment of the invention, the composition (C) comprises at least one initiator (PI) in an amount comprised between 3% and 7% by weight, with respect to the total weight of the composition (C).

The thermal initiator [initiator (TI)] is typically selected from the group consisting of organic peroxides.

The crosslinkable fluoropolymer film [film (FC)] is crosslinked typically either by UV treatment under UV radiation or by thermal treatment.

For the purpose of the present invention, the term "UV radiation" is intended to denote electromagnetic radiation with a wavelength shorter than that of visible light but longer than soft X-rays. It can be subdivided into near UV (380-200 nm wavelength; abbreviation: NUV), far or vacuum UV (200-10 nm; abbreviation: FUV or VUV), and extreme UV (1-31 nm; abbreviation: EUV or XUV). NUV having a wavelength of from 200 nm to 380 nm is preferred in the process of the invention. Either monochromatic or polychromatic radiation can be used.

UV radiation can be provided in the crosslinking process of the invention by any suitable UV radiation source.

Thermal treatment is typically carried out at a temperature comprised between 60° C. and 150° C., preferably between 100° C. and 135° C.

The crosslinkable fluoropolymer film [film (FC)] may be a patterned crosslinkable fluoropolymer film [film (FCp)].

For the purpose of the present invention, the term "patterned crosslinkable fluoropolymer film [film (FCp)]" is intended to denote a fluoropolymer film having whichever pattern geometry.

In a fourth instance, the present invention pertains to an electrical or electronic device comprising at least one fluoropolymer film [film (F)] of the invention.

Non-limitative examples of suitable electronic devices include transducers, sensors, actuators, ferroelectric memories and capacitors powdered by electrical devices.

For the purpose of the present invention, the term "(per) fluorinated monomer" is intended to denote an ethylenically unsaturated monomer comprising at least one fluorine atom.

The polymer (F) may further comprise from 1% to 15% by moles, preferably from 4% to 10% by moles, with respect to the total amount by moles of recurring units of said polymer (F), of recurring units derived from at least one (per)fluorinated monomer selected from the group consisting of:

(a) $C_2$-$C_8$ perfluoroolefins such as tetrafluoroethylene (TFE), hexafluoropropylene (HFP) and hexafluoroisobutylene;

(b) perfluoroalkylethylenes of formula $CH_2$=CH—$R_{f0}$, wherein $R_{f0}$ is a $C_2$-$C_6$ perfluoroalkyl group;

(c) $C_2$-$C_8$ chloro- and/or bromo- and/or iodo-fluoroolefins such as chlorofluoroethylene (CFE) and chlorotrifluoroethylene (CTFE);

(d) (per)fluoroalkylvinylethers of formula $CF_2$=CFOR$_{f1}$, wherein $R_{f1}$ is a $C_1$-$C_6$ (per)fluoroalkyl group, e.g. $CF_3$ (PMVE), $C_2F_5$, $C_3F_7$;

(e) (per)fluorooxyalkylvinylethers of formula $CF_2$=CFOX$_0$, wherein $X_0$ is a $C_1$-$C_{12}$ oxyalkyl group or a $C_1$-$C_{12}$ (per)fluorooxyalkyl group comprising one or more ether groups, e.g. perfluoro-2-propoxy-propyl group;

(f) (per)fluoroalkylvinylethers of formula $CF_2$=CFOCF$_2$OR$_{f2}$, wherein $R_{f2}$ is a $C_1$-$C_6$ (per)fluoroalkyl group, e.g. —$CF_3$, —$C_2F_5$, —$C_3F_7$, or a $C_1$-$C_6$ (per)fluorooxyalkyl group comprising one or more ether groups, e.g. —$C_2F_5$—O—$CF_3$;

(g) functional (per)fluorooxyalkylvinylethers of formula $CF_2$=CFOY$_0$, wherein $Y_0$ is selected from a $C_1$-$C_{12}$ alkyl group or (per)fluoroalkyl group, a $C_1$-$C_{12}$ oxyalkyl group and a $C_1$-$C_{12}$ (per)fluorooxyalkyl group comprising one or more ether groups, $Y_0$ comprising a carboxylic or sulfonic acid group, in its acid, acid halide or salt form;

(h) (per)fluorodioxoles of formula:

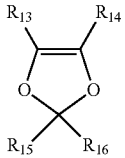

wherein each of $R_{f3}$, $R_{f4}$, $R_{f5}$ and $R_{f6}$, equal to or different from each other, is independently a fluorine atom, a $C_1$-$C_6$ fluoro- or per(halo)fluoroalkyl group, optionally comprising one or more oxygen atoms, e.g. —$CF_3$, —$C_2F_5$, —$C_3F_7$, —$OCF_3$, —$OCF_2CF_2OCF_3$.

According to a first embodiment of the invention, the polymer (F) comprises:

from 55% to 83% by moles, preferably from 60% to 81% by moles, with respect to the total amount by moles of recurring units of said polymer (F), of recurring units derived from vinylidene fluoride (VDF), and from 17% to 45% by moles, preferably from 19% to 40% by moles, with respect to the total amount by moles of recurring units of said polymer (F), of recurring units derived from trifluoroethylene (TrFE).

According to a second embodiment of the invention, the polymer (F) comprises:

from 40% to 82% by moles, preferably from 56% to 77% by moles, with respect to the total amount by moles of recurring units of said polymer (F), of recurring units derived from vinylidene fluoride (VDF), from 17% to 45% by moles, preferably from 19% to 40% by moles, with respect to the total amount by moles of recurring units of said polymer (F), of recurring units derived from trifluoroethylene (TrFE), and from 1% to 15% by moles, preferably from 4% to 10% by moles, with respect to the total amount by moles of recurring units of said polymer (F), of recurring units derived from at least one (per)fluorinated monomer different from VDF and TrFE.

The polymer (F) may further comprise recurring units derived from at least one hydrogenated monomer.

For the purpose of the present invention, the term "hydrogenated monomer" is hereby intended to denote an ethylenically unsaturated monomer comprising at least one hydrogen atom and free from fluorine atoms.

The polymer (F) typically further comprises recurring units derived from at least one hydrogenated monomer selected from the group consisting of (meth)acrylic monomers of formula (I) and vinyl ether monomers of formula (II):

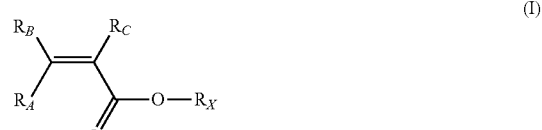

wherein each of $R_A$, $R_B$ and $R_C$, equal to or different from each other, is independently a hydrogen atom or a $C_1$-$C_3$ hydrocarbon group, $R_X$ is a hydrogen atom or a $C_1$-$C_5$ hydrocarbon group comprising at least one hydroxyl group, and $R'_X$ is a $C_1$-$C_5$ hydrocarbon group comprising at least one hydroxyl group.

The polymer (F) typically further comprises from 0.01% to 10% by moles, preferably from 0.03% to 6% by moles, with respect to the total amount by moles of recurring units of said polymer (F), of recurring units derived from at least one hydrogenated monomer selected from the group consisting of (meth)acrylic monomers of formula (I) and vinyl ether monomers of formula (II):

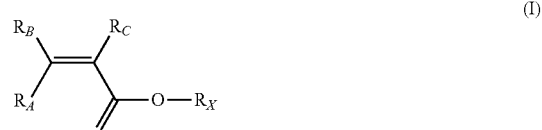

wherein each of $R_A$, $R_B$ and $R_C$, equal to or different from each other, is independently a hydrogen atom or a $C_1$-$C_3$ hydrocarbon group, $R_X$ is a hydrogen atom or a $C_1$-$C_5$ hydrocarbon group comprising at least one hydroxyl group, and $R'_X$ is a $C_1$-$C_5$ hydrocarbon group comprising at least one hydroxyl group.

The hydrogenated monomer is preferably a (meth)acrylic monomer of formula (I) as defined above.

The (meth)acrylic monomer is more preferably of formula (I-A):

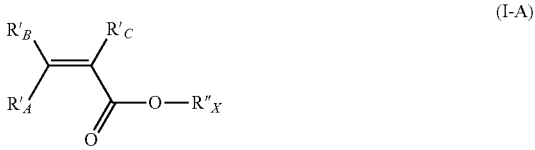

(I-A)

wherein each of $R'_A$ and $R'_B$, equal to or different from each other, is independently a hydrogen atom or a $C_1$-$C_3$ hydrocarbon group, preferably $R'_A$ and $R'_B$ being hydrogen atoms, $R'_C$ is a hydrogen atom, and $R''_X$ is a hydrogen atom or a $C_1$-$C_5$ hydrocarbon group comprising at least one hydroxyl group.

Non-limitative examples of (meth)acrylic monomers of formula (I) notably include acrylic acid, methacrylic acid, hydroxyethyl(meth)acrylate, hydroxypropyl(meth)acrylate, hydroxyethylhexyl(meth)acrylate.

The (meth)acrylic monomer of formula (I) is even more preferably selected from the group consisting of:

hydroxyethylacrylate (HEA) of formula:

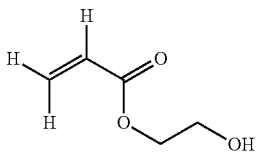

2-hydroxypropyl acrylate (HPA) of either of formulae:

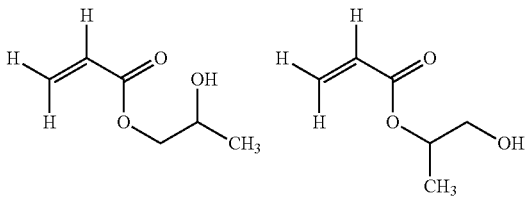

acrylic acid (AA) of formula:

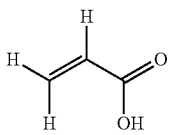

and mixtures thereof.

The (meth)acrylic monomer of formula (I) is still more preferably acrylic acid (AA) or hydroxyethylacrylate (HEA).

The polymer (F) is preferably selected from those according to the second embodiment of the invention.

The polymer (F) may be amorphous or semi-crystalline.

The term "amorphous" is hereby intended to denote a polymer (F) having a heat of fusion of less than 5 J/g, preferably of less than 3 J/g, more preferably of less than 2 J/g, as measured according to ASTM D-3418-08.

The term "semi-crystalline" is hereby intended to denote a polymer (F) having a heat of fusion of from 10 J/g to 90 J/g, preferably of from 30 J/g to 60 J/g, more preferably of from 35 J/g to 55 J/g, as measured according to ASTM D3418-08.

The polymer (F) has typically a heat of fusion of from 10 J/g to 80 J/g, preferably of from 10 J/g to 60 J/g, more preferably of from 10 J/g to 55 J/g, as measured according to ASTM D3418.

The polymer (F) has typically a melt flow index of at most 500 g/10 min, preferably of at most 200 g/10 min, more preferably of at most 50 g/10 min, as measured according to ASTM D1238 (230° C., 5 Kg).

The polymer (F) has typically a melt flow index of at least 0.1 g/10 min, preferably of at least 1 g/10 min, more preferably of at least 1.5 g/10 min, as measured according to ASTM D1238 (230° C., 5 Kg).

The polymer (F) can be manufactured either by aqueous suspension polymerization or by aqueous emulsion polymerization.

The polymer (F) is preferably manufactured by aqueous emulsion polymerization of vinylidene fluoride (VDF), trifluoroethylene (TrFE), optionally, at least one (per)fluorinated monomer different from VDF and TrFE and, optionally, at least one hydrogenated monomer in the presence of at least one radical initiator in a polymerization medium comprising:
water,
at least one surfactant and
optionally, at least one non-functional perfluoropolyether oil.

Polymerization pressure ranges typically between 10 bar and 45 bar, preferably between 15 bar and 40 bar, more preferably between 20 bar and 35 bar.

The skilled in the art will choose the polymerization temperature having regards, inter alia, of the radical initiator used. Polymerization temperature is generally selected in the range comprised between 80° C. and 140° C., preferably between 95° C. and 130° C.

Emulsion polymerization processes as detailed above have been described in the art (see e.g. U.S. Pat. No. 4,990,283 (AUSIMONT SPA (IT)) Feb. 5, 1991, U.S. Pat. No. 5,498,680 (AUSIMONT SPA) Mar. 12, 1996 and U.S. Pat. No. 6,103,843 (AUSIMONT SPA) Aug. 15, 2000).

Should the polymer (F) be manufactured by aqueous suspension polymerization, the polymerization medium typically results in an aqueous slurry comprising the polymer (F) from which said polymer (F) is recovered by concentration and/or coagulation of said aqueous slurry and then submitted to drying.

Should the polymer (F) be manufactured by aqueous emulsion polymerization, the polymerization medium typically results in an aqueous latex comprising the polymer (F) and at least one surfactant from which said polymer (F) is recovered by concentration and/or coagulation of said aqueous latex and then submitted to drying.

Drying is typically carried out in suitable heating devices, generally electric ovens or convection ovens. Drying is carried out at a temperature typically up to 300° C., preferably up to 200° C., more preferably up to 100° C. Drying is carried out for a time typically of from 1 to 60 hours, preferably of from 10 to 50 hours.

The polymer (F) is typically recovered by the polymerization medium in the form of particles. The polymer (F) is commonly recovered by the polymerization medium in the form of particles such as flakes, rods, thread-like particles and mixtures thereof.

The polymer (F) particles recovered by the polymerization medium may be further processed by melt-processing techniques thereby providing pellets.

The polymer (F) may be used either in the form of particles or in the form of pellets.

The polymer (F) is preferably used in the form of particles such as flakes, rods, thread-like particles and mixtures thereof.

The particle size of the polymer (F) is not particularly limited. The skilled in the art will select the proper particle size of the polymer (F) in order to suitably adjust its time of dissolution in the medium (L).

The polymer (F) is advantageously a linear polymer [polymer ($F_L$)] comprising linear sequences of recurring units derived from vinylidene fluoride (VDF), trifluoroethylene (TrFE), optionally, at least one (per)fluorinated monomer different from VDF and TrFE and, optionally, at least one hydrogenated monomer.

The polymer (F) is thus typically distinguishable from graft polymers.

The polymer (F) is advantageously a random polymer [polymer ($F_R$)] comprising linear sequences of randomly distributed recurring units derived from vinylidene fluoride (VDF), trifluoroethylene (TrFE), optionally, at least one (per)fluorinated monomer different from VDF and TrFE and, optionally, at least one hydrogenated monomer.

The polymer (F) is thus typically distinguishable from block polymers.

The polymer (F) typically comprises one or more chain branches comprising end groups of formulae —$CF_2H$ and/or —$CF_2CH_3$, which usually originate from intra-chain transfer (back-biting) during radical polymerization as shown in the scheme here below:

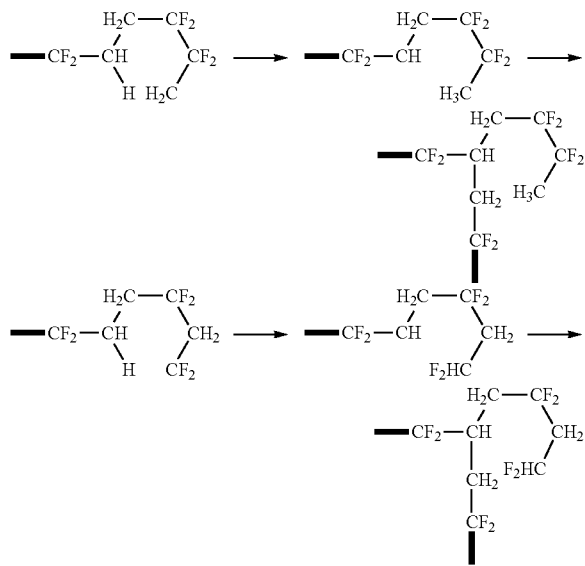

According to a first embodiment of the invention, the polymer (F) comprises one or more chain branches comprising end groups of formula —$CF_2H$ and/or —$CF_2CH_3$ in an amount of less than 30 mmoles per Kg of vinylidene fluoride (VDF) recurring units, preferably of less than 20 mmoles per Kg of VDF recurring units [polymer (F-A)].

The polymer (F-A) according to this first embodiment of the invention typically comprises one or more chain branches comprising end groups of formula —$CF_2H$ and/or —$CF_2CH_3$ in an amount of at least 2 mmoles per Kg of vinylidene fluoride (VDF) recurring units, preferably of at least 5 mmoles per Kg of VDF recurring units.

According to a second embodiment of the invention, the polymer (F) comprises one or more chain branches comprising end groups of formula —$CF_2H$ and/or —$CF_2CH_3$ in an amount of at least 30 mmoles per Kg of vinylidene fluoride (VDF) recurring units, preferably of at least 40 mmoles per Kg of VDF recurring units [polymer (F-B)].

The polymer (F-B) according to this second embodiment of the invention typically comprises one or more chain branches comprising end groups of formula —$CF_2H$ and/or —$CF_2CH_3$ in an amount of at most 120 mmoles per Kg of vinylidene fluoride (VDF) recurring units, preferably of at most 100 mmoles per Kg of VDF recurring units For the purpose of the present invention, the term (per)fluoroelastomer [elastomer (F)] is intended to denote a fluoropolymer resin serving as base constituent for obtaining a true elastomer, said fluoropolymer resin comprising more than 10% by weight, preferably more than 30% by weight of recurring units derived from at least one (per)fluorinated monomer and, optionally, recurring units derived from at least one hydrogenated monomer.

True elastomers are defined by the ASTM, Special Technical Bulletin, No. 184 standard as materials capable of being stretched, at room temperature, to twice their intrinsic length and which, once they have been released after holding them under tension for 5 minutes, return to within 10% of their initial length in the same time.

The elastomer (F) may further comprise recurring units derived from at least one hydrogenated monomer selected from the group consisting of hydrogenated alpha-olefins such as ethylene, propylene and 1-butene, diene monomers and styrene monomers.

The elastomer (F) is typically amorphous. The term "amorphous" is hereby intended to denote a polymer (F) having a heat of fusion of less than 5 J/g, preferably of less than 3 J/g, more preferably of less than 2 J/g, as measured according to ASTM D-3418-08.

The elastomer (F) typically has a glass transition temperature ($T_g$) below room temperature. In most cases, the elastomer (F) has advantageously a $T_g$ below 10° C., preferably below 5° C., more preferably below 0° C.

The elastomer (F) is preferably selected from the group consisting of:

(1) VDF-based copolymers, wherein VDF is copolymerized with at least one (per)fluorinated monomer selected from the group consisting of:

(a') $C_2$-$C_8$ perfluoroolefins such as tetrafluoroethylene (TFE), hexafluoropropylene (HFP) and hexafluoroisobutylene;

(b') hydrogen-containing $C_2$-$C_8$ olefins such as vinyl fluoride (VF), perfluoroalkyl ethylenes of formula $CH_2$=CH—$R_f$, wherein $R_f$ is a $C_1$-$C_6$ perfluoroalkyl group;

(c') $C_2$-$C_8$ chloro- and/or bromo- and/or iodo-fluoroolefins such as chlorotrifluoroethylene (CTFE);

(d') (per)fluoroalkylvinylethers (PAVE) of formula $CF_2$=$CFOR_{f1}$, wherein $R_{f1}$ is a $C_1$-$C_6$ (per)fluoroalkyl group, e.g. $CF_3$ (PMVE), $C_2F_5$, $C_3F_7$;

(e') (per)fluorooxyalkylvinylethers of formula $CF_2$=$CFOX_0$, wherein $X_0$ is a $C_1$-$C_{12}$ oxyalkyl group or a $C_1$-$C_{12}$ (per)fluorooxyalkyl group comprising one or more catenary oxygen atoms, e.g. perfluoro-2-propoxypropyl group;

(f') (per)fluorodioxoles of formula:

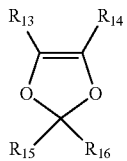

wherein each of $R_{f3}$, $R_{f4}$, $R_{f5}$ and $R_{f6}$, equal to or different from each other, is independently a fluorine atom, a $C_1$-$C_6$ fluoro- or per(halo)fluoroalkyl group, optionally comprising one or more oxygen atoms, e.g. —$CF_3$, —$C_2F_5$, —$C_3F_7$, —$OCF_3$, —$OCF_2CF_2OCF_3$;

(g') (per)fluoromethoxyvinylethers (MOVE, hereinafter) of formula $CFX_2$=$CX_2OCF_2OR''_f$, wherein $R''_f$ is selected from $C_1$-$C_6$ linear or branched (per)fluoroalkyl groups, $C_5$-$C_6$ cyclic (per)fluoroalkyl groups, and $C_2$-$C_6$ linear or branched (per)fluorooxyalkyl groups comprising from 1 to 3 catenary oxygen atoms, and $X_2$=F, H; preferably $X_2$ is F and $R''_f$ is —$CF_2CF_3$ (MOVE1), —$CF_2CF_2OCF_3$ (MOVE2), or —$CF_3$ (MOVE3); and (h') $C_2$-$C_8$ non-fluorinated olefins (OI), for example ethylene and propylene; and (2) TFE-based copolymers, wherein TFE is copolymerized with at least one (per)fluorinated monomer selected from classes (c'), (d'), (e'), (g'), (h') as defined above and the following:

(i') perfluorovinyl ethers containing cyanide groups.

Among above referred elastomers (F), VDF-based copolymers are preferred.

Optionally, the elastomer (F) may also comprise recurring units derived from a bis-olefin [bis-olefin (OF)] of formula:

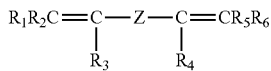

wherein $R_1$, $R_2$, $R_3$, $R_4$, $R_5$ and $R_6$, equal to or different from each other, are selected from the group consisting of H atoms and $C_1$-$C_5$ alkyl groups, Z is a linear or branched $C_1$-$C_{18}$ alkylene or cycloalkylene group, optionally comprising one or more oxygen atoms, preferably at least partially fluorinated, or a (per)fluoropolyoxyalkylene group, e.g. as described in EP 661304 A (AUSIMONT SPA) Jul. 5, 1995.

The bis-olefin (OF) is preferably selected from the group consisting of those of any of formulae (OF-1), (OF-2) and (OF-3):

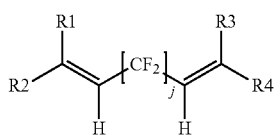

wherein j is an integer comprised between 2 and 10, preferably between 4 and 8, and R1, R2, R3, R4, equal to or different from each other, are selected from the group consisting of H, F, $C_{1-5}$ alkyl groups and (per)fluoroalkyl groups;

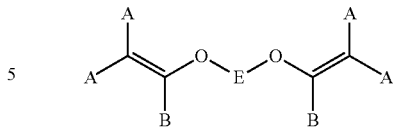

wherein each of A, equal to or different from each other and at each occurrence, is independently selected from the group consisting of F, Cl, and H; each of B, equal to or different from each other and at each occurrence, is independently selected from the group consisting of F, Cl, H and $OR_B$, wherein $R_B$ is a branched or straight chain alkyl group which may be partially, substantially or completely fluorinated or chlorinated, E is a divalent group having 2 to 10 carbon atoms, optionally fluorinated, which may be inserted with ether linkages; preferably E is a —$(CF_2)_m$— group, wherein m is an integer comprised between 3 and 5; a preferred bis-olefin of (OF-2) type is $F_2C$=CF—O—$(CF_2)_5$—O—CF=$CF_2$.

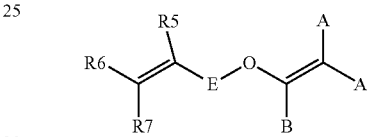

wherein E, A and B have the same meaning as defined above, R5, R6, R7, equal to or different from each other, are selected from the group consisting of H, F, $C_1$-$C_5$ alkyl groups and (per)fluoroalkyl groups.

Among specific compositions of elastomers (F) suitable for the purpose of the invention, mention can be made of the following compositions (% by moles):

(I) vinylidene fluoride (VDF) 35-85%, hexafluoropropylene (HFP) 10-45%, tetrafluoroethylene (TFE) 0-30%, perfluoroalkyl vinyl ethers (PAVE) 0-15%, bis-olefin (OF) 0-5%;

(II) vinylidene fluoride (VDF) 50-80%, perfluoroalkyl vinyl ethers (PAVE) 5-50%, tetrafluoroethylene (TFE) 0-20%, bis-olefin (OF) 0-5%;

(III) vinylidene fluoride (VDF) 20-30%, $C_2$-$C_8$ non-fluorinated olefins (OI) 10-30%, hexafluoropropylene (HFP) and/or perfluoroalkyl vinyl ethers (PAVE) 18-27%, tetrafluoroethylene (TFE) 10-30%, bis-olefin (OF) 0-5%;

(IV) tetrafluoroethylene (TFE) 50-80%, perfluoroalkyl vinyl ethers (PAVE) 20-50%, bis-olefin (OF) 0-5%;

(V) tetrafluoroethylene (TFE) 45-65%, $C_2$-$C_8$ non-fluorinated olefins (OI) 20-55%, vinylidene fluoride 0-30%, bis-olefin (OF) 0-5%;

(VI) tetrafluoroethylene (TFE) 32-60% mol %, $C_2$-$C_8$ non-fluorinated olefins (OI) 10-40%, perfluoroalkyl vinyl ethers (PAVE) 20-40%, fluorovinyl ethers (MOVE) 0-30%, bis-olefin (OF) 0-5%;

(VII) tetrafluoroethylene (TFE) 33-75%, perfluoroalkyl vinyl ethers (PAVE) 15-45%, vinylidene fluoride (VDF) 5-30%, hexafluoropropylene (HFP) 0-30%, bis-olefin (OF) 0-5%;

(VIII) vinylidene fluoride (VDF) 35-85%, fluorovinyl ethers (MOVE) 5-40%, perfluoroalkyl vinyl ethers (PAVE) 0-30%, tetrafluoroethylene (TFE) 0-40%, hexafluoropropylene (HFP) 0-30%, bis-olefin (OF) 0-5%;

(IX) tetrafluoroethylene (TFE) 20-70%, fluorovinyl ethers (MOVE) 30-80%, perfluoroalkyl vinyl ethers (PAVE) 0-50%, bis-olefin (OF) 0-5%.

According to certain embodiments, the elastomer (F) comprises iodine and/or bromine cure sites. Iodine cure sites are those selected for maximizing curing rate. Elastomers (F) according to these embodiments are advantageously suitable for peroxide-curing or any mixed curing technique involving peroxide agents.

For ensuring acceptable reactivity it is generally understood that the content of iodine and/or bromine in the elastomer (F) should be of advantageously at least 0.05% by weight, preferably of at least 0.1% by weight, more preferably of at least 0.15% by weight, with respect to the total weight of said elastomer (F).

On the other side, amounts of iodine and/or bromine not exceeding 2% by weight, more specifically not exceeding 1% by weight, or even not exceeding 0.5% by weight, with respect to the total weight of said elastomer (F), are those generally selected for avoiding side reactions and/or detrimental effects on thermal stability.

All these cure sites might be comprised as pending groups bound to the backbone of the elastomer (F) polymer chain or might be comprised as terminal groups of said polymer chain.

According to a first embodiment, the iodine and/or bromine cure sites are comprised as pending groups bound to the backbone of the elastomer (F) polymer chain; the elastomer (F) according to this embodiment typically comprises recurring units derived from brominated and/or iodinated cure-site comonomers selected from:

bromo and/or iodo alpha-olefins containing from 2 to 10 carbon atoms such as bromotrifluoroethylene or bromotetrafluorobutene described, for example, in U.S. Pat. No. 4,035,565 (DU PONT) Jul. 12, 1977 or other compounds bromo and/or iodo alpha-olefins disclosed in U.S. Pat. No. 4,694,045 (DU PONT) Sep. 15, 1987;

iodo and/or bromo fluoroalkyl vinyl ethers (as notably described in U.S. Pat. No. 4,745,165 (AUSIMONT SPA) May 17, 1988, U.S. Pat. No. 4,564,662 (MINNESOTA MINING & MFG [US]) Jan. 14, 1986 and EP 199138 A (DAIKIN IND LTD) Oct. 29, 1986).

The elastomer (F) according to this embodiment generally comprises recurring units derived from brominated and/or iodinated cure-site monomers in amounts of 0.05 to 5 moles per 100 moles of all other recurring units of said elastomer (F) so as to advantageously ensure above mentioned iodine and/or bromine weight content.

According to a second preferred embodiment, the iodine and/or bromine cure sites are comprised as terminal groups of the elastomer (F) polymer chain; the elastomer (F) according to this embodiment is generally obtained by addition to the polymerization medium during fluoroelastomer manufacture of anyone of iodinated and/or brominated chain-transfer agent(s).

Suitable chain-chain transfer agents are typically those of formula $R_f(I)_x(Br)_y$, wherein $R_f$ is a (per)fluoroalkyl or a (per)fluorochloroalkyl group containing from 1 to 8 carbon atoms, while x and y are integers between 0 and 2, with $1 \leq x+y \leq 2$ (see, for example, U.S. Pat. No. 4,243,770 (DAIKIN IND LTD) Jan. 6, 1981 and U.S. Pat. No. 4,943,622 (NIPPON MEKTRON KK) Jul. 24, 1990); and alkali metal or alkaline-earth metal iodides and/or bromides, as described notably in U.S. Pat. No. 5,173,553 (AUSIMONT SRL) Dec. 22, 1992.

The elastomer (F) can be prepared by any known method such as emulsion or micro-emulsion polymerization, suspension or micro-suspension polymerization, bulk polymerization and solution polymerization.

Should the disclosure of any patents, patent applications, and publications which are incorporated herein by reference conflict with the description of the present application to the extent that it may render a term unclear, the present description shall take precedence.

The invention will be now described in more detail with reference to the following examples whose purpose is merely illustrative and not limitative of the scope of the invention.

Raw Materials

Polymer (F-1) prepared following the procedure according to Example 4 of WO 2012/084579 (SOLVAY SPECIALTY POLYMERS ITALY S.P.A.) Jun. 28, 2012: VDF (65.95% by moles)-TrFE (27.48% by moles)-CTFE (6.50% by moles)-AA (0.07% by moles).

Polymer (F-2) prepared following the procedure according to Example 1 of WO 2012/084579 (SOLVAY SPECIALTY POLYMERS ITALY S.P.A.) Jun. 28, 2012: VDF (75.61% by moles)-TrFE (24.27% by moles)-AA (0.12% by moles).

Polymer (F-3) prepared following the procedure for the manufacture of the polymer (F-7) of WO 2015/169836 (SOLVAY SPECIALTY POLYMERS ITALY S.P.A.) Nov. 12, 2015: VDF (63% by moles)-TrFE (28% by moles)-CTFE (9% by moles).

Polymer (F-4) prepared following the procedure for the manufacture of the polymer (F-2) of WO 2015/169836 (SOLVAY SPECIALTY POLYMERS ITALY S.P.A.) Nov. 12, 2015: VDF (75% by moles)-TrFE (25% by moles).

Fluoroelastomer (F-a): TECNOFLON® N 215 fluoroelastomer is an ionic curable VDF-HFP polymer having a Mooney viscosity ML (1+10) at 121° C. (ASTM D 1646) of 10, a fluorine content of 66% by weight and a $T_g$ (ASTM D 1329) of about −17° C.

Fluoroelastomer (F-b): TECNOFLON® N 60 HS fluoroelastomer is an ionic curable VDF-HFP polymer having a Mooney viscosity ML (1+10) at 121° C. (ASTM D 1646) of 27, a fluorine content of 66% by weight and a $T_g$ (ASTM D 1329) of about −17° C.

Fluoroelastomer (F-c): TECNOFLON® PL 458 fluoroelastomer is a peroxide curable VDF-TFE-PMVE polymer having a Mooney viscosity ML (1+10) at 121° C. (ASTM D 1646) of 29, a fluorine content of 66% by weight and a $T_g$ (ASTM D 1329) of about −24° C.

Fluoroelastomer (F-d): TECNOFLON® P 457 is a peroxide curable VDF-HFP-TFE polymer having a Mooney viscosity ML (1+10) at 121° C. (ASTM D 1646) of 21, a fluorine content of 67% by weight and a $T_g$ (ASTM D 1329) of about −15° C.

PMMA: methacrylic copolymer.

Manufacture of a Fluoropolymer Film

The films can be obtained either by doctor blade or by spin coating. Doctor blade: The solution obtained using the proper solvent for doctor blade application was loaded onto a glass substrate positioned on an Elcometer automatic film applicator (model 4380) thereby providing a glass substrate coated with a polymer layer. The substrate was then dried at 100° C. for 2 hours under vacuum. For each sample, by inkjet printing technique, 12 patterns of 1 cm×1 cm were printed as electrodes on both sides of the polymer layer using as conductive material a poly(3,4-ethylenedioxythiophene) polystyrene sulfonate (PEDOT:PSS) purchased by Agfa-Gevaert under the trademark name ORGACON®. The thickness of the samples was measured using a Mitutoyo micrometer. Spin coating: The solution was loaded into a Laurell WS-650 LITE SERIES spin coater and spin-coated at a speed of 2000 rpm onto silicon wafer substrates in order to obtain very thin polymer layers on silicon wafer as substrate. The polymer layers so obtained were dried at 85° C. for 20 minutes. For each sample, two polymeric films on silicon wafer were prepared. The samples thereby obtained were all homogeneous and completely optically transparent. The thickness of the samples was measured using a Filmetrics F20 unit.

Determination of the Dielectric Constant of the Fluoropolymer Film

The value of dielectric permittivity [k] was derived from the direct measurement of dielectric capacitance by a piezo meter system provided by Piezotest. The capacitance values were all measured at 110 Hz. The measurements were also used to check the electrical homogeneity and electrical conductivity of the electrodes.

$$\text{Dielectric permittivity } [k] = \frac{\text{Capacitance } [F] \times \text{Thickness } [m]}{\varepsilon_0 [F/m] \times \text{Area } [m^2]}$$

Determination of the Electrical Resistivity of the Fluoropolymer Film

The determination of the electrical resistance was carried out using a Radiant Technologies Inc. Precision tester. A Bias Voltage was applied to the samples and the current intensity across the thickness of these samples was measured. The value of the electrical resistivity was derived from the ratio of the Bias Voltage and the current intensity normalized to the thickness of the samples and their active area. The electrical resistivity values set forth in Table 1 refer to values taken after 8000 ms.

$$\text{Resistance } [\Omega] = \frac{DC \text{ Bias } [V]}{\text{Current } [A]}$$

$$\text{Resisstivity } [\Omega \times cm] = \frac{\text{Resistance } [\Omega] \times \text{Area } [cm^2]}{\text{Thickness } [cm]}$$

EXAMPLE 1

A fluoropolymer film was manufactured according to general procedure using a composition containing the polymer (F-1) and 3% by weight, with respect to the total weight of said composition, of the fluoroelastomer (F-a).

EXAMPLE 2

The same procedure as detailed under Example 1 was followed except that a fluoroelastomer (F-b) was used in place of the fluoroelastomer (F-a).

EXAMPLE 3

The same procedure as detailed under Example 1 was followed except that a fluoroelastomer (F-c) was used in place of the fluoroelastomer (F-a).

EXAMPLE 4

The same procedure as detailed under Example 1 was followed except that a fluoroelastomer (F-d) was used in place of the fluoroelastomer (F-a).

EXAMPLE 5

The same procedure as detailed under Example 1 was followed except that a polymer (F-2) was used in place of the polymer (F-1).

EXAMPLE 6

The same procedure as detailed under Example 1 was followed except that a polymer (F-3) was used in place of the polymer (F-1).

EXAMPLE 7

The same procedure as detailed under Example 1 was followed except that a polymer (F-4) was used in place of the polymer (F-1).

COMPARATIVE EXAMPLE 1

The same procedure under Example 1 was followed but using a composition containing only the polymer (F-1).

COMPARATIVE EXAMPLE 2

The same procedure under Example 1 was followed but using a composition wherein the fluoroelastomer (F-a) was replaced by PMMA in an amount of 3% by weight, with respect to the total weight of said composition.

COMPARATIVE EXAMPLE 3

The same procedure under Example 1 was followed but using a composition wherein the fluoroelastomer (F-a) was replaced by PMMA in an amount of 6% by weight, with respect to the total weight of said composition.

COMPARATIVE EXAMPLE 4

The same procedure under Example 1 was followed but using a composition containing only the polymer (F-2).

COMPARATIVE EXAMPLE 5

The same procedure under Example 1 was followed but using a composition containing only the polymer (F-3).

COMPARATIVE EXAMPLE 6

The same procedure under Example 1 was followed but using a composition containing only the polymer (F-4).

As shown in Table 1 hereinbelow, each of the fluoropolymer films obtained according to any of Examples 1 to 4 according to the invention is advantageously endowed with a high dielectric constant value close to the dielectric constant value of the fluoropolymers film made of the pure polymer (F-1) according to Comparative Example 1.

Each of the fluoropolymer films obtained according to any of Examples 1 to 4 according to the invention is also advantageously endowed with a higher dielectric constant value as compared to the dielectric constant value of the fluoropolymer films obtained according to any of Comparative Examples 2 and 3.

Also, as shown in Table 1 hereinbelow, each of the fluoropolymer films obtained according to any of Examples 1 to 4 according to the invention is advantageously endowed with a high resistivity value close to the resistivity value of the fluoropolymer films obtained according to any of Comparative Examples 2 and 3.

Each of the fluoropolymer films obtained according to any of Examples 1 to 4 according to the invention is also advantageously endowed with a higher resistivity value as compared to the resistivity value of the fluoropolymer film made of the pure polymer (F-1) according to Comparative Example 1.

Further, as shown in Table 1 hereinbelow, each of the fluoropolymer films obtained according to any of Examples 5 to 7 according to the invention is advantageously endowed with a high dielectric constant value close to the dielectric constant value of the fluoropolymers film made of the pure polymer (F-2), polymer (F-3) and polymer (F-4), respectively, according to Comparative Examples 4 to 6, respectively.

Each of the fluoropolymer films obtained according to any of Examples 5 to 7 according to the invention is also advantageously endowed with a higher resistivity value as compared to the resistivity value of the fluoropolymer film made of the pure polymer (F-2), polymer (F-3) and polymer (F-4), respectively, according to Comparative Examples 4 to 6, respectively.

TABLE 1

| | Dielectric constant (110 Hz) | Electrical Resistivity (8000 ms, bias 33 V/μm) [Ω · cm] |
|---|---|---|
| Ex. 1 | 26.67 | $1.15 \cdot 10^{12}$ |
| Ex. 2 | 27.80 | $1.06 \cdot 10^{12}$ |
| Ex. 3 | 27.20 | $1.06 \cdot 10^{12}$ |
| Ex. 4 | 27.51 | $1.54 \cdot 10^{12}$ |
| C. Ex. 1 | 28.89 | $5.26 \cdot 10^{11}$ |
| C. Ex. 2 | 23.12 | $2.11 \cdot 10^{12}$ |
| C. Ex. 3 | 19.83 | $2.53 \cdot 10^{12}$ |
| Ex. 5 | 11.21 | $1.04 \cdot 10^{13}$ |
| C. Ex. 4 | 11.72 | $8.26 \cdot 10^{11}$ |
| Ex. 6 | 27.02 | $2.14 \cdot 10^{11}$ |
| C. Ex. 5 | 28.62 | $6.47 \cdot 10^{10}$ |
| Ex. 7 | 11.11 | $6.02 \cdot 10^{12}$ |
| C. Ex. 6 | 11.91 | $1.04 \cdot 10^{11}$ |

The composition (C) according to the present invention may be advantageously used in a process for the manufacture of fluoropolymer films thereby providing for homogeneous fluoropolymer films advantageously endowed with a high dielectric constant and a low leakage current while exhibiting good mechanical properties to be suitably used in various applications including electrical or electronic devices.

The invention claimed is:

1. A composition (C) comprising:
(A) from 90% to 99% by weight of at least one polymer (F), wherein polymer (F) is a fluoropolymer comprising:
from 40% to 82% by moles of recurring units derived from vinylidene fluoride (VDF),
from 19% to 40% by moles, with respect to the total amount by moles of recurring units of said polymer (F), of recurring units derived from trifluoroethylene (TrFE), and
from 1% to 15% by moles, with respect to the total amount by moles of recurring units of said polymer (F), of recurring units derived from at least one (per)fluorinated monomer different from VDF and TrFE,
wherein the recurring units derived from vinylidene fluoride (VDF) are the complement to 100% by moles of total recurring units, and
(B) from 1% to 10% by weight of at least one elastomer (F), wherein elastomer (F) is a (per)fluoroelastomer,
wherein the composition (C) has a higher resistivity compared to the resistivity value of a composition comprising only the fluoropolymer.

2. The composition (C) according to claim 1, wherein polymer (F) comprises:
from 55% to 83% by moles, with respect to the total amount by moles of recurring units of said polymer (F), of recurring units derived from vinylidene fluoride (VDF), and
from 19% to 40% by moles, with respect to the total amount by moles of recurring units of said polymer (F), of recurring units derived from trifluoroethylene (TrFE).

3. The composition (C) according to claim 2, wherein polymer (F) comprises:
from 60% to 81% by moles, with respect to the total amount by moles of recurring units of said polymer (F), of recurring units derived from vinylidene fluoride (VDF), and
from 19% to 40% by moles, with respect to the total amount by moles of recurring units of said polymer (F), of recurring units derived from trifluoroethylene (TrFE).

4. The composition (C) according to claim 1, wherein polymer (F) comprises one or more chain branches comprising end groups of formulae —$CF_2H$ and/or —$CF_2CH_3$ in an amount of at least 30 mmoles per Kg of vinylidene fluoride (VDF) recurring units.

5. The composition (C) according to claim 1, wherein elastomer (F) is a VDF-based copolymer, wherein VDF is copolymerized with at least one monomer selected from the group consisting of:
(a') $C_2$-$C_8$ perfluoroolefins;
(b') hydrogen-containing $C_2$-$C_8$ olefins;
(c') $C_2$-$C_8$ chloro- and/or bromo- and/or iodo-fluoroolefins;
(d') (per)fluoroalkylvinylethers (PAVE) of formula $CF_2$=$CFOR_{f1}$, wherein $R_{f1}$ is a $C_1$-$C_6$ (per)fluoroalkyl group;
(e') (per)fluorooxyalkylvinylethers of formula $CF_2$=$CFOX_0$, wherein $X_0$ is a $C_1$-$C_6$ oxyalkyl group or a $C_1$-$C_{12}$ (per)fluorooxyalkyl group comprising one or more catenary oxygen atoms;
(f') (per)fluorodioxoles of formula:

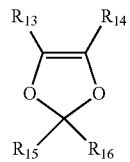

wherein each of $R_{f3}$, $R_{f4}$, $R_{f5}$, $R_{f6}$, equal to or different from each other, is independently a fluorine atom, or a $C_1$-$C_6$ fluoro- or per(halo)fluoroalkyl group, optionally comprising one or more oxygen atoms;
(g') (per)fluoromethoxyvinylethers of formula $CFX_2$=$CX_2OCF_2OR''_f$ wherein $R''_f$ is selected from $C_1$-$C_6$ linear or branched (per)fluoroalkyl groups, $C_5$-$C_6$ cyclic (per)fluoroalkyl groups, and $C_2$-$C_6$ linear or branched (per)fluorooxyalkyl groups comprising from 1 to 3 catenary oxygen atoms, and $X_2$ is F or H; and (h') $C_2$-$C_8$ non-fluorinated olefins (O1).

6. The composition (C) according to claim 1, wherein elastomer (F) has a glass transition temperature ($T_g$) below 10° C.

7. The composition (C) according to claim 6, wherein elastomer (F) has a glass transition temperature ($T_g$) below 5° C.

8. The composition (C) according to claim 1, said composition (C) further comprising one or more additives selected from the group consisting of crosslinking agents and crosslinking initiators.

9. The composition (C) according to claim 1, said composition (C) further comprising a liquid medium (L).

10. A fluoropolymer film (F) comprising the composition (C) according to claim 1.

11. An electrical or electronic device comprising at least one film (F) according to claim 10.

12. A process for the manufacture of a film (F) comprising the composition (C) according to claim 1, said process comprising processing the composition (C) into a film.

13. The process according to claim 12, said process comprising:
applying the composition (C) onto at least one surface of a substrate thereby providing a wet film, and drying the wet film thereby providing the fluoropolymer film (F).

14. The composition (C) according to claim 1, wherein said composition (C) comprises:
(A) from 95% to 98.5% by weight of at least one polymer (F), and
(B) from 1.5% to 5% by weight of at least one elastomer (F).

15. The composition (C) according to claim 1, wherein polymer (F) comprises:
from 56% by moles to 77% by moles, with respect to the total amount by moles of recurring units of said polymer (F), of recurring units derived from vinylidene fluoride (VDF),
from 19% to 40% by moles, with respect to the total amount by moles of recurring units of said polymer (F), of recurring units derived from trifluoroethylene (TrFE), and
from 4% to 10% by moles, with respect to the total amount by moles of recurring units of said polymer (F), of recurring units derived from at least one (per)fluorinated monomer different from VDF and TrFE.

16. A composition (C) comprising:
(A) from 90% to 99% by weight of at least one polymer (F), wherein polymer (F) is a fluoropolymer comprising:
recurring units derived from vinylidene fluoride (VDF),
from 19% to 40% by moles, with respect to the total amount by moles of recurring units of said polymer (F), of recurring units derived from trifluoroethylene (TrFE), and
optionally, from 1% to 15% by moles, with respect to the total amount by moles of recurring units of said polymer (F), of recurring units derived from at least one (per)fluorinated monomer different from VDF and TrFE, wherein the recurring units derived from vinylidene fluoride (VDF) are the complement to 100% by moles of total recurring units, and
(B) from 1% to 10% by weight of at least one elastomer (F), wherein elastomer (F) is a (per)fluoroelastomer,
wherein the composition (C) has a higher resistivity compared to the resistivity value of a composition comprising only the fluoropolymer, and
wherein polymer (F) comprises 0.01% to 10% by moles, with respect to the total amount by moles of recurring units of said polymer (F), of recurring units derived from at least one hydrogenated monomer selected from the group consisting of (meth)acrylic monomers of formula (I):

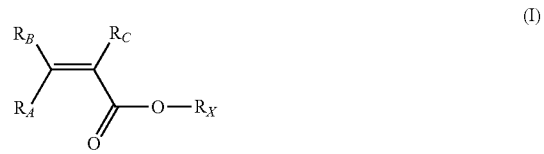

wherein each of $R_A$, $R_B$ and $R_C$, equal to or different from each other, is independently a hydrogen atom or a $C_1$-$C_3$ hydrocarbon group, and $R_X$ is a hydrogen atom or a $C_1$-$C_5$ hydrocarbon group comprising at least one hydroxyl group.

17. The composition (C) according to claim 16, wherein polymer (F) comprises from 0.03% to 6% by moles, with respect to the total amount by moles of recurring units of said polymer (F), of recurring units derived from at least one (meth)acrylic monomer of formula (I).

18. A composition (C) comprising:
(A) from 90% to 99% by weight of at least one polymer (F), wherein polymer (F) is a fluoropolymer comprising:
recurring units derived from vinylidene fluoride (VDF),
from 19% to 40% by moles, with respect to the total amount by moles of recurring units of said polymer (F), of recurring units derived from trifluoroethylene (TrFE), and
optionally, from 1% to 15% by moles, with respect to the total amount by moles of recurring units of said polymer (F), of recurring units derived from at least one (per)fluorinated monomer different from VDF and TrFE,
wherein the recurring units derived from vinylidene fluoride (VDF) are the complement to 100% by moles of total recurring units, and
(B) from 1% to 10% by weight of at least one elastomer (F), wherein elastomer (F) is a (per)fluoroelastomer,
wherein the composition (C) has a higher resistivity compared to the resistivity value of a composition comprising only the fluoropolymer,
wherein polymer (F) comprises one or more chain branches comprising end groups of formulae —$CF_2H$ and/or —$CF_2CH_3$.

* * * * *